United States Patent
Yang

(10) Patent No.: US 11,953,870 B2
(45) Date of Patent: Apr. 9, 2024

(54) SYSTEM AND METHOD FOR CONTROLLING SOLAR PHOTOVOLTAIC POWER GENERATION ON BASIS OF MACHINE LEARNING

(71) Applicant: NANOOMENERGY CO., LTD., Jeju-si (KR)

(72) Inventor: Jihyeok Yang, Jeju-si (KR)

(73) Assignee: NANOOMENERGY CO., LTD., Jeju-si (KR)

(*) Notice: Subject to any disclaimer, the term of this patent is extended or adjusted under 35 U.S.C. 154(b) by 403 days.

(21) Appl. No.: 17/296,965

(22) PCT Filed: Nov. 7, 2019

(86) PCT No.: PCT/KR2019/015018
§ 371 (c)(1),
(2) Date: May 25, 2021

(87) PCT Pub. No.: WO2020/111561
PCT Pub. Date: Jun. 4, 2020

(65) Prior Publication Data
US 2022/0029423 A1 Jan. 27, 2022

(30) Foreign Application Priority Data
Nov. 27, 2018 (KR) .................. 10-2018-0148821

(51) Int. Cl.
*G05B 15/02* (2006.01)
(52) U.S. Cl.
CPC .................. *G05B 15/02* (2013.01)

(58) Field of Classification Search
CPC .... G05B 15/02; H02H 1/0084; H02H 1/0092; H02H 3/385; H02H 7/205; H02H 3/243;
(Continued)

(56) References Cited

U.S. PATENT DOCUMENTS

| 2012/0072039 A1* | 3/2012 | Anderson .............. G06Q 10/04 700/297 |
| 2020/0011731 A1* | 1/2020 | Siddiqui ................. H02J 3/004 |

FOREIGN PATENT DOCUMENTS

| JP | 2014155271 A | 8/2014 |
| KR | 20130001389 A | 1/2013 |

(Continued)

OTHER PUBLICATIONS

International Search Report of PCT/KR2019/015018, dated Feb. 25, 2020, English translation.

*Primary Examiner* — Mohammad Ali
*Assistant Examiner* — Saad M Kabir
(74) *Attorney, Agent, or Firm* — STIP Law Group, LLC

(57) ABSTRACT

The present invention are a system and a method for controlling solar photovoltaic power generation on the basis of machine learning, the system comprising: solar photovoltaic modules; node control units for switching off a connected solar photovoltaic module when measured current, voltage and power data do not satisfy control data; a gateway unit for storing measured data; a real-time control module for classifying, comparing and analyzing data and storing same, and transmitting a control command to the gateway unit; and machine learning for monitoring a device and data, learning on the basis of machine learning, and extracting functional data required for controlling solar photovoltaic power generation so as to provide control service data according to the result of performed modeling.

5 Claims, 8 Drawing Sheets

(58) Field of Classification Search
CPC ........ G01R 19/16547; G01R 19/16538; G01R 21/06; G06N 20/00; G08C 2201/42; G08C 17/02; H02S 50/00; H02S 40/36
See application file for complete search history.

(56) References Cited

FOREIGN PATENT DOCUMENTS

| | | | |
|---|---|---|---|
| KR | 20180008820 | A | 1/2018 |
| KR | 20180112496 | A | 10/2018 |
| KR | 20180123951 | A | 11/2018 |
| KR | 101958941 | B1 | 3/2019 |

* cited by examiner

SYSTEM AND METHOD FOR CONTROLLING SOLAR PHOTOVOLTAIC POWER GENERATION ON BASIS OF MACHINE LEARNING

CROSS-REFERENCE TO RELATED APPLICATIONS

This application is the U.S. National Phase under 35 U.S.C. § 371 of International Application No. PCT/KR2019/015018 filed on Nov. 7, 2019, which in turn claims the benefit of Korean Application No. 10-2018-0148821 filed on Nov. 27, 2018, the disclosures of which are incorporated by reference into the present application.

TECHNICAL FIELD

The present invention relates to a machine-learning-based photovoltaic power generation control system and method, and more particularly to a machine-learning-based photovoltaic power generation control system and method capable of collecting voltage and electric power information of photovoltaic modules in real time, learning the collected information through a machine learning platform, controlling the photovoltaic modules based on control information extracted by performing modeling for various service functions according to the result of learning, and analyzing devices connected to the photovoltaic modules in real time in order to control a photovoltaic power generation system in real time.

BACKGROUND ART

Photovoltaic power generation is a power generation method of converting sunlight into DC current to produce electricity. Photovoltaic panels, in each of which several solar cells are connected to each other, are arranged on a large scale in order to produce electricity using photovoltaic energy.

In order to solve environmental pollution and resource depletion problems, renewable energy projects have been actively promoted all over the world.

In Korea, photovoltaic power sources using solar energy have been increasingly installed every year in order to cope with environmental pollution and energy crisis, and state diagnosis technology for performance improvement and power generation amount forecasting technology are required.

With recent introduction of renewable energy, such as solar energy, and energy storage systems, a next-generation smart grid capable of optimizing energy efficiency has been increasingly popularized as technology for controlling integration operation and electric power amount thereof.

In the current maintenance and management system for photovoltaic power sources, however, only the output of an inverter of the overall system is measured, and simple on-site monitoring using a web cam is performed. When trouble occurs during operation, therefore, it takes much time to recognize performance deterioration and operation stoppage causes and positions at which trouble occurs. In addition, it is difficult to recognize change in power generation amount depending on trouble type, trouble pattern, and environmental change due to absence of data on photovoltaic power sources.

In addition, FIG. 1 is a schematic view showing a conventional general photovoltaic power generation state diagnosis system. The conventional photovoltaic power generation technology has problems in that, in the case in which any one of a plurality of solar cell modules is in trouble, it is difficult to recognize which module is in trouble or is abnormal, and it is impossible to determine from a remote place whether the power generation amount is low due to low insolation or the power generation amount is reduced by module trouble or abnormality.

Particularly, in the case in which the power generation amount of a specific module of a photovoltaic panel that produces electric power is reduced due to module trouble or abnormality, the overall photovoltaic electric power amount is reduced, whereby electric power generation is hindered.

Consequently, a conventional photovoltaic power generation system is affected by characteristics of a large number of photovoltaic modules and devices connected thereto. However, it is difficult to control all of such individual characteristics, and therefore, a photovoltaic power generation control system utilizing a machine learning technique is required.

DISCLOSURE

Technical Problem

The present invention has been made in view of the above problems, and it is an object of the present invention to provide a machine-learning-based photovoltaic power generation control system and method capable of collecting voltage and electric power information of photovoltaic modules in real time, learning the collected information through a machine learning platform, controlling the photovoltaic modules based on control information extracted by performing modeling for various service functions according to the result of learning, and analyzing devices connected to the photovoltaic modules in real time in order to control a photovoltaic power generation system in real time.

Technical Solution

A machine-learning-based photovoltaic power generation control system according to the present invention includes a plurality of photovoltaic modules configured to convert photovoltaic energy into electrical energy in order to perform photovoltaic power generation, the photovoltaic modules being connected to each other in series so as to be arranged in at least two rows and at least two columns, node controllers configured to measure voltage, current, and electric power data produced by the photovoltaic modules and, when the measured data are less than set current, voltage, and electric power control data, to switch off the photovoltaic modules connected thereto, a gateway unit configured to receive the voltage, current, and electric power data measured by the photovoltaic modules from the node controllers, to parse the measured data, and to store the measured data, a real-time control module configured to receive the parsed data from the gateway unit, to sort, compare, and analyze the received data, to store the data in a database, and to transmit a control command for setting control data necessary to control the node controllers to the gateway unit, and a machine learning server connected to the real-time control module over the Internet or a communication network, the machine learning server being configured to monitor a photovoltaic power generation construction device including the photovoltaic modules and data, to learn the data transmitted from the real-time control module based on machine learning, to extract functional data necessary to control photovoltaic power generation to perform modeling, and to provide control service data based on the result of modeling to the real-time control module.

Also, in the machine-learning-based photovoltaic power generation control system according to the present invention, each of the node controllers may include a measurement unit configured to measure voltage, current, and electric power data produced by a corresponding one of the photovoltaic modules, an analysis and control unit configured to compare the measured data with the control data transmitted from the real-time control module, the control data being defined to control current and voltage, and to determine whether the measured data are less than the defined control data to switch the operation of a corresponding one of the photovoltaic modules, a data transmission and management unit configured to transmit data stored in the node controller to the outside, to receive the control data from the real-time control module, and to transmit the received control data to the node controller, and a switching unit configured to switch off or on the photovoltaic module connected to the node controller based on the result of determination of the analysis and control unit.

Also, in the machine-learning-based photovoltaic power generation control system according to the present invention, the gateway unit may include a data collection and management unit configured to transmit the measured data received from the node controllers to the real-time control module, to receive control command data transmitted from the real-time control module, and to transmit the received control command data to the node controllers, a data processing unit configured to parse the measured data received from the node controllers, and a data storage unit configured to store the data parsed by the data processing unit.

Also, in the machine-learning-based photovoltaic power generation control system according to the present invention, the real-time control module may include an interface unit configured to perform real-time data transmission and reception between the gateway unit and the real-time control module and between the real-time control module and the machine learning server, a data analysis unit configured to receive the current, voltage, and electric power data measured by the photovoltaic module through the gateway unit and to sort, compare, and analyze the received data, a control and determination unit configured to extract reference data necessary to control the photovoltaic modules using the result of processing of the data analysis unit and to determine a control command, a control command processing unit configured to define control data in order to control the photovoltaic modules and to transmit the defined control data to the gateway unit in real time, and a service management unit configured to perform a management function of adding or deleting a control function for controlling the photovoltaic modules in the real-time control module.

Also, in the machine-learning-based photovoltaic power generation control system according to the present invention, the machine learning server may include an interface unit configured to allow the machine learning server to perform real-time data transmission and reception therethrough, a monitoring unit configured to monitor photovoltaic power generation data transmitted from a photovoltaic power generation construction device including the photovoltaic modules, the node controllers, the gateway unit, and the real-time control module through integrated processing including analysis, sorting, comparison, and conversion based on characteristics thereof, a determination unit configured to determine whether machine learning is to be performed based on profile information of the integrated-processed data transmitted from the monitoring unit, a learning module configured to perform new learning for data necessary to be newly learned according to determination of the determination unit, a modeling unit configured to extract data using the result of learning and to perform modeling, a learning database configured to store the result of learning and the result of modeling, a controller configured to retrieve modeling data from the learning database in order to control photovoltaic power generation and to transmit the modeling data to a service unit configured to control photovoltaic power generation together with data determined not to be learned by the determination unit; a service unit configured to select one of reference models transmitted from the controller, to define photovoltaic power generation control service data, and to transmit the data to the real-time control module through the interface unit, and a service management module configured to delete, add, update, and manage a modeling data list transmitted to the service unit.

Also, in the machine-learning-based photovoltaic power generation control system according to the present invention, the monitoring unit may be configured to transmit and receive data to and from the real-time control module through a data interface, and the service unit may be connected to an open type interface unit, the service unit being configured to convert data received from the controller into an application service so as to be provided or to provide data required by various application programs.

Meanwhile, a machine-learning-based photovoltaic power generation control method according to the present invention includes node controllers measuring voltage, current, and electric power data produced by photovoltaic modules, a gateway unit receiving the measured data from the node controllers, parsing the measured data, and storing the measured data, a real-time control module sorting, comparing, and analyzing the parsed data, storing the data in a database, and transmitting the data to a machine learning server, the machine learning server learning the data transmitted from the real-time control module based on machine learning, extracting functional data necessary to control photovoltaic power generation to perform modeling, and providing control service data based on the result of modeling to the real-time control module, the real-time control module transmitting control command data necessary to control the node controllers to the gateway unit, the gateway unit transmitting the control command data received from the real-time control module to the node controllers, and the node controllers switching off the photovoltaic modules connected thereto when data measured by the photovoltaic modules are less than current, voltage, and electric power control reference data set according to the control command data.

Advantageous Effects

According to the present invention, voltage and electric power information of photovoltaic modules is collected in real time, the collected information is learned in a machine learning platform, the photovoltaic modules are controlled based on control information extracted by performing modeling for various service functions according to the result of learning, whereby the amount of electric power produced by the photovoltaic modules is controlled so as to be uniform, and therefore the optimum production amount of electric power is maintained.

In addition, the specifications of information transmission devices and electric devices used for various photovoltaic power generation and protocol are registered, controlled based on machine learning, and managed, whereby information of various information transmission devices and electric devices connected to a low-level local space may be easily connected, and the protocol is defined, and service modules are developed.

In addition, according to the present invention, measured data of each of the photovoltaic modules is transmitted to the machine learning platform, and device-in-trouble recognition information and type information are transmitted to a machine learning server through a learning function, whereby it is possible to analyze trouble state of a wide-area photovoltaic power generation device and trouble type characteristics thereof in real time and to provide the same to a user.

BEST MODE

Hereinafter, a machine-learning-based photovoltaic power generation control system and method according to embodiments of the present invention will be described in detail with reference to the accompanying drawings.

Figure 1:
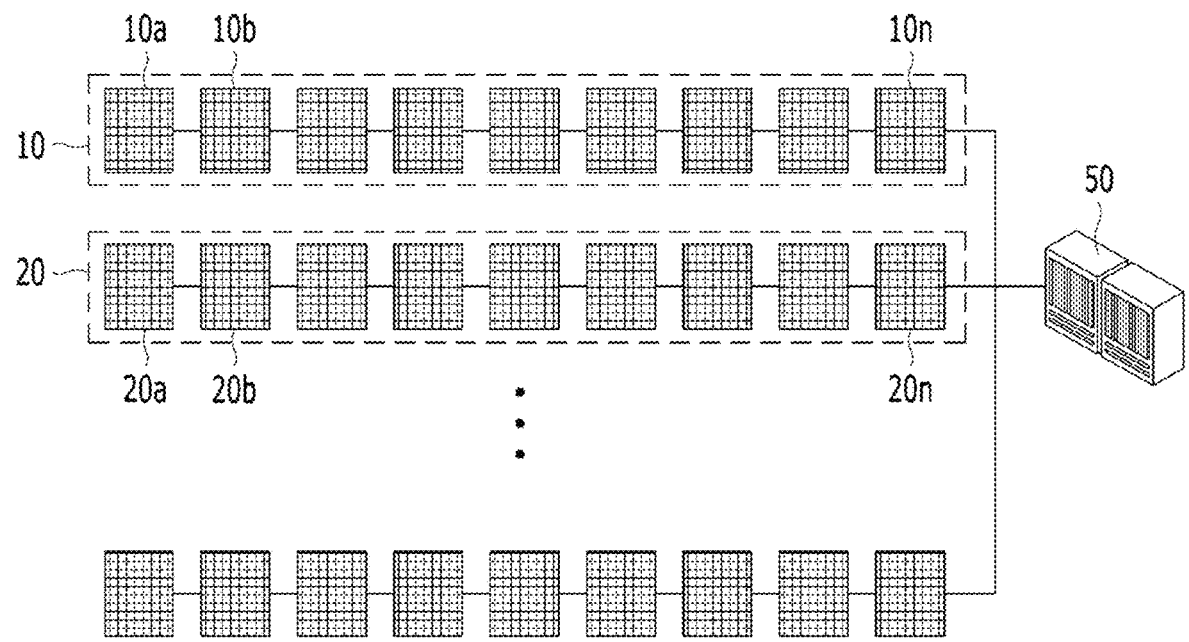
FIG. 1 is a schematic view showing a conventional general photovoltaic power generation state diagnosis system.
Figure 2:
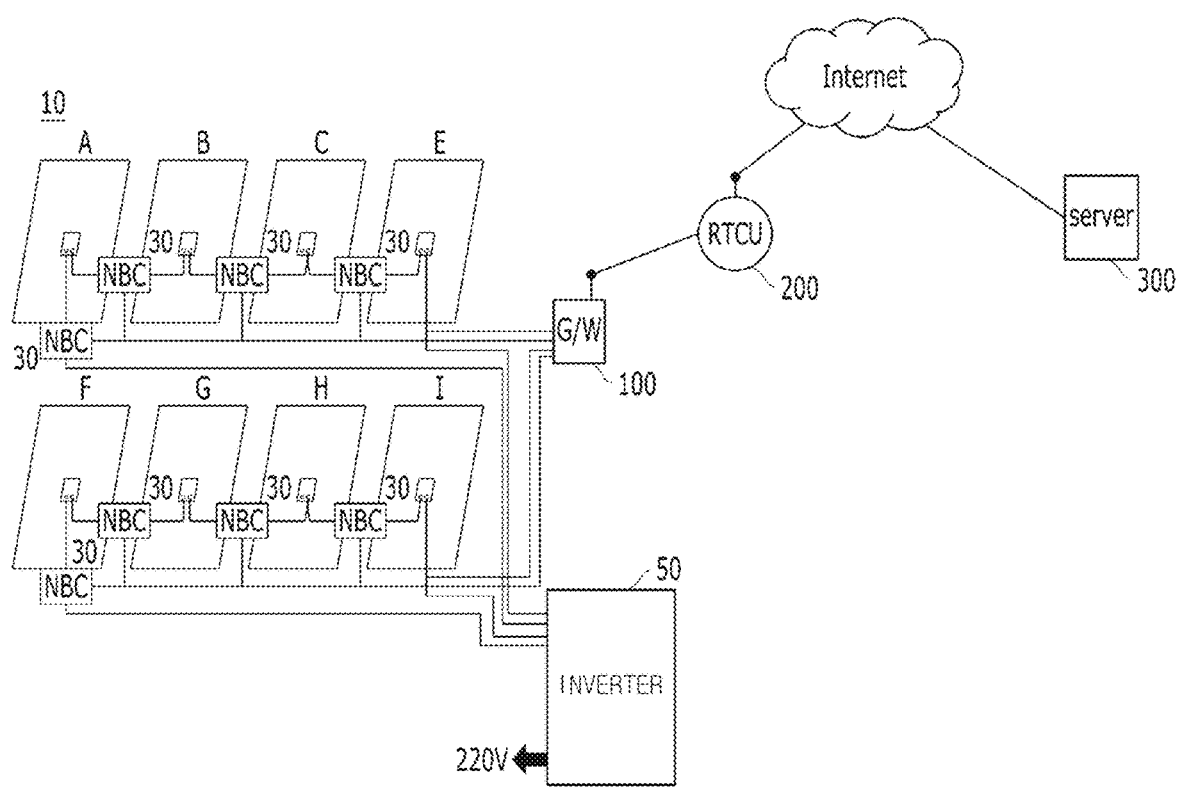
FIG. 2 is an overall construction block diagram of a machine-learning-based photovoltaic power generation control system according to the present invention.

FIG. 2 is an overall construction block diagram of a machine-learning-based photovoltaic power generation control system according to the present invention.

Referring to FIG. 2, the machine-learning-based photovoltaic power generation control system according to the embodiment of the present invention includes a plurality of photovoltaic modules 10, node controllers (NBC) 30, an inverter 50, a gateway unit (G/W) 100, a real-time control module (RTCU), and a machine learning server 300.

The plurality of photovoltaic modules 10, which converts photovoltaic energy into electrical energy to perform photovoltaic power generation, is connected to each other in series so as to be arranged in at least two rows and at least two columns.

A photovoltaic power generator includes at least one string constituted by the photovoltaic modules 10, each of which is a minimum unit configured to transmit actually generated electricity to the outside, are connected to each other in series, and a plurality of strings is connected to each other so as to constitute an array. For large-scale photovoltaic power generation, a minimum of tens of arrays and a maximum of hundreds of arrays are installed.

Electric power produced by the plurality of photovoltaic modules is transmitted to the inverter 50 through 6 channels or 12 channels so as to be converted into alternating-current electric power, such as 220 V.

Each of the node controllers 30 is connected to a corresponding one of the photovoltaic modules 10 in order to measure voltage, current, and electric power data produced by the photovoltaic module 10 connected thereto. When the measured data are less than set current, voltage, and electric power control data, the node controller switches off the photovoltaic module connected thereto.

As shown in FIG. 2, the photovoltaic modules 10 (A to I) are connected to each other in series, and the node controllers 30 are connected to the series-connected photovoltaic modules 10 in series so as to have the same structure.

Voltage, current, and electric power data are measured and collected from the photovoltaic modules connected to the node controllers 30, and the measured data are compared with control data defined to control current and voltage transmitted from the real-time control module 200 to determine whether the measured data are less than the defined control data. The photovoltaic module 10 at the node determined to be in trouble, among the nodes connected to the node controllers 30, is switched off, whereby electric power produced by the photovoltaic module 10 in trouble is not transmitted to the inverter 50. Consequently, electric power produced by all of the photovoltaic modules 10 is maintained uniform, whereby a nonuniform amount of electric power produced by the photovoltaic modules 10 is adjusted to achieve optimum electric power production. In this way, balancing control is performed.

The gateway unit 100 receives the voltage, current, and electric power data measured by the photovoltaic modules from the node controllers 30, parses the measured data, and stores the measured data.

The real-time control module 200 receives the current, voltage, and electric power data measured by the photovoltaic modules 10 via the gateway unit 100, sorts, compares, and analyzes the received data, stores the same in a database, and transmits a control command for setting control data necessary to control the node controllers 30 to the gateway unit 100.

In addition, the machine learning server 300, which is connected to the real-time control module 200 over the Internet or a communication network, monitors a photovoltaic power generation construction device including the photovoltaic modules and data, learns the data transmitted from the real-time control module 200 based on machine learning, extracts functional data necessary to control photovoltaic power generation to perform modeling, and provides control service data based on the result of modeling to the real-time control module 200.

Meanwhile, depending on embodiments or design changes, the function of the machine learning server may be performed by the real-time control module 200.

Figure 3:
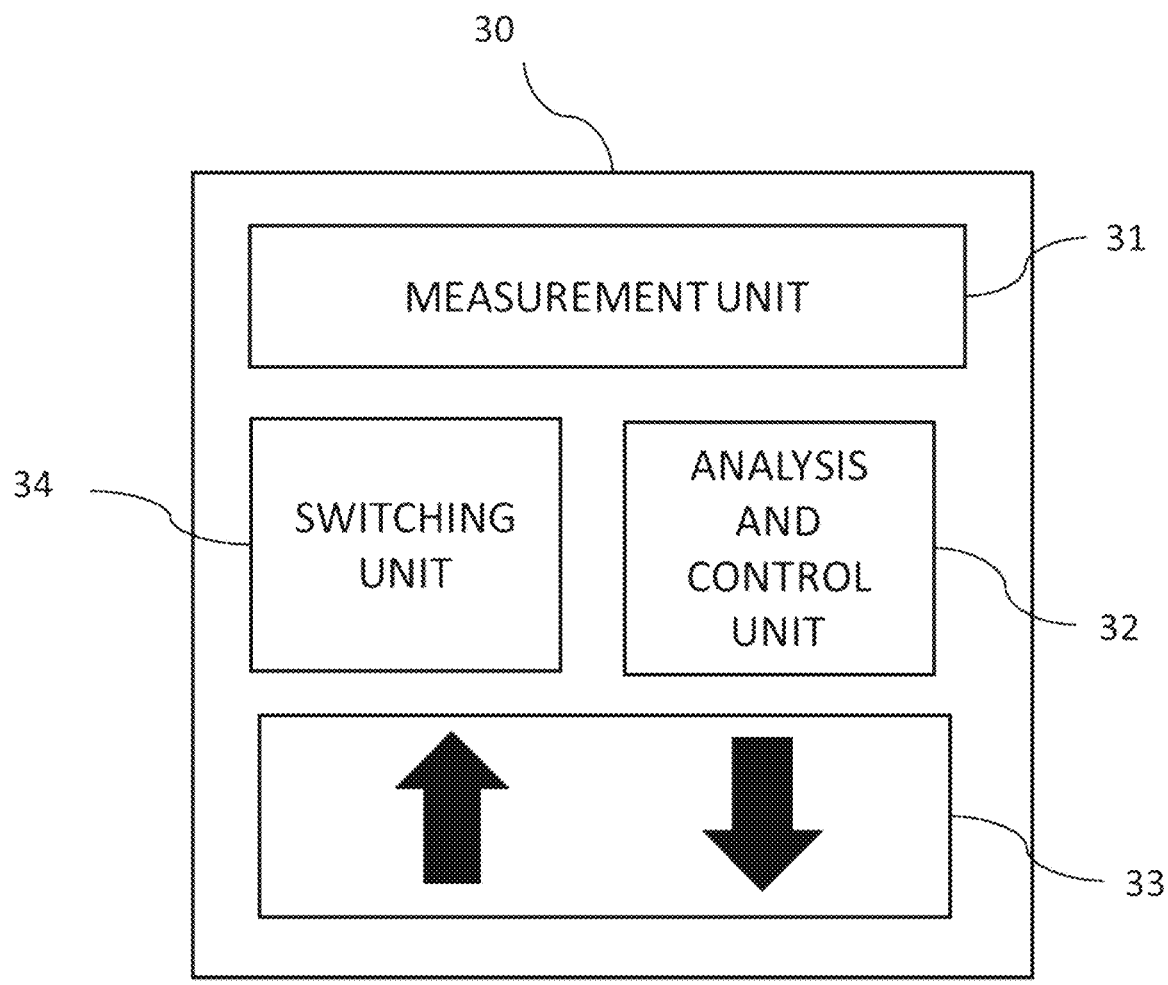
FIG. 3 is a construction block diagram of a node controller in the machine-learning-based photovoltaic power generation control system shown in FIG. 2.

FIG. 3 is a construction block diagram of the node controller in the machine-learning-based photovoltaic power generation control system shown in FIG. 2.

Referring to FIG. 3, in the machine-learning-based photovoltaic power generation control system according to the present invention, the node controller 30 includes a measurement unit 31, an analysis and control unit 32, a data transmission and management unit 33, and a switching unit 34.

The measurement unit 31 measures voltage, current, and electric power data produced by the photovoltaic modules 10.

The measurement unit 31 measures voltage, current, and electric power produced by the photovoltaic modules 10, each of which is constituted by an electric power production panel, and transmits the same to the analysis and control unit 32.

The analysis and control unit 32 adjusts the operation level of the switching unit 34 based on the measured current, voltage, and electric power data of the photovoltaic modules secured from the measurement unit 31 and the current and voltage control data values transmitted from the real-time control module 200 and set such that the switching unit 34 switches off the photovoltaic module 10 connected to the node controller 30.

That is, the analysis and control unit 32 compares the measured data with the control data transmitted from the real-time control module 200, the control data being defined to control current and voltage of the photovoltaic module, and determines whether the measured data are less than the defined control data to switch the operation of the photovoltaic module.

The data transmission and management unit 33 transmits data stored in the node controller 30 to the outside, receives the control data from the real-time control module 200 via the gateway unit 100, and transmits the received control data to the node controller 30.

In addition, the switching unit 34 switches off or on the photovoltaic module connected to the node controller 30 based on the result of determination of the analysis and control unit 32.

Figure 4:
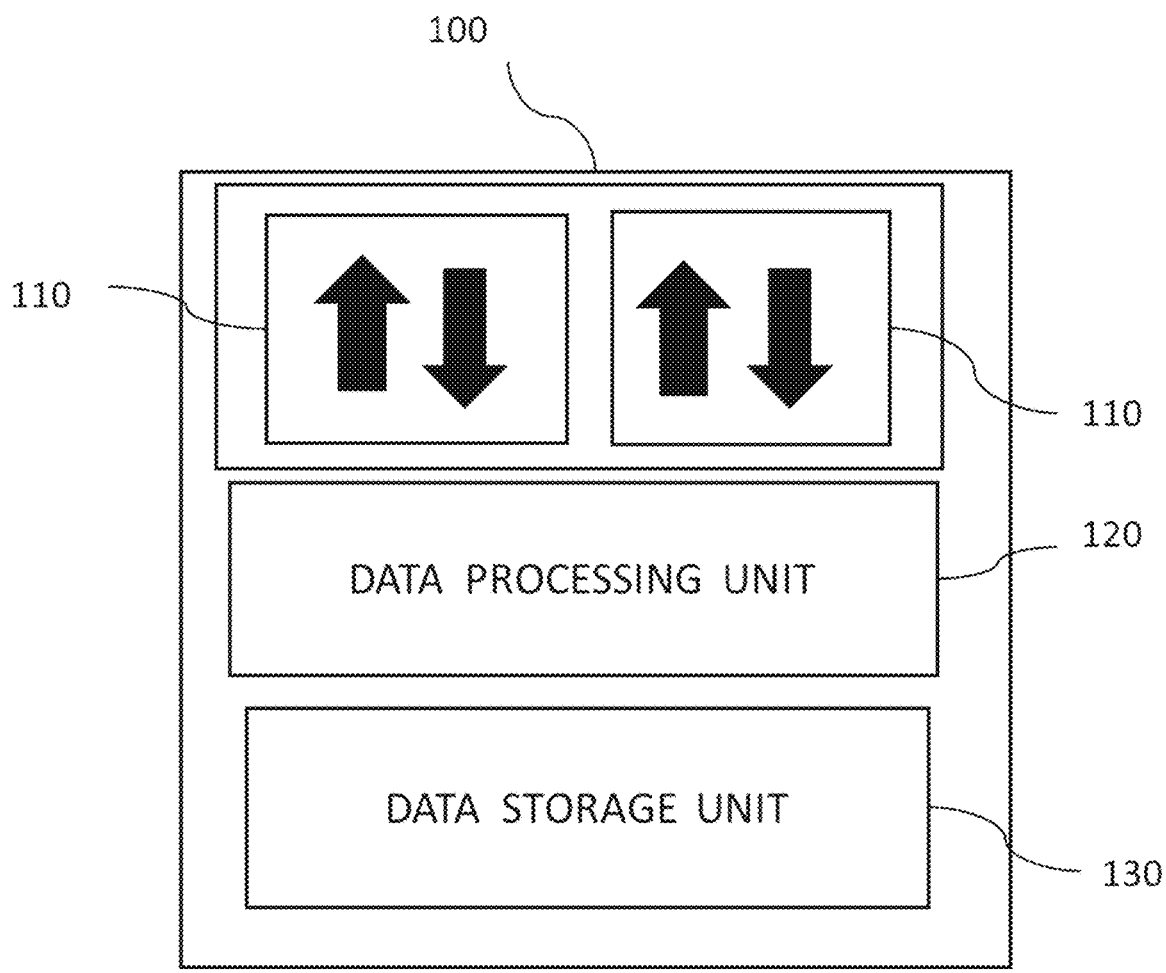
FIG. 4 is a construction block diagram of a gateway unit in the machine-learning-based photovoltaic power generation control system shown in FIG. 2.

FIG. 4 is a construction block diagram of the gateway unit in the machine-learning-based photovoltaic power generation control system shown in FIG. 2.

Referring to FIG. 4, in the machine-learning-based photovoltaic power generation control system according to the present invention, the gateway unit 100 includes a data collection and management unit 110, a data processing unit 120, and a data storage unit 130.

The data collection and management unit 110 transmits the measured data received from the node controllers 30 to the real-time control module 200, receives control command data transmitted from the real-time control module 200, and transmits the same to the node controllers 30.

Information transmitted to the data collection and management unit 110, which is information transmitted from the node controllers 30, has a special management function in order for node controllers 30 connected to 10×16 photovoltaic modules per gateway unit to safely transmit photovoltaic module connection data through connection or to safely transmit correct data through disconnection.

The data processing unit 120 parses the measured data received from the node controllers 30.

The data are parsed (encoded/decoded) in order to minimize the amount of data that are transmitted or received by the data collection and management unit 110, and the parsed data are transmitted to and stored in the data storage unit 130.

The data storage unit 130 stores the data in a file data system structure or a database structure such that the stored information can be easily used, and the stored data are transmitted to the real-time control module 200 via the data collection and management unit 110.

Figure 5:
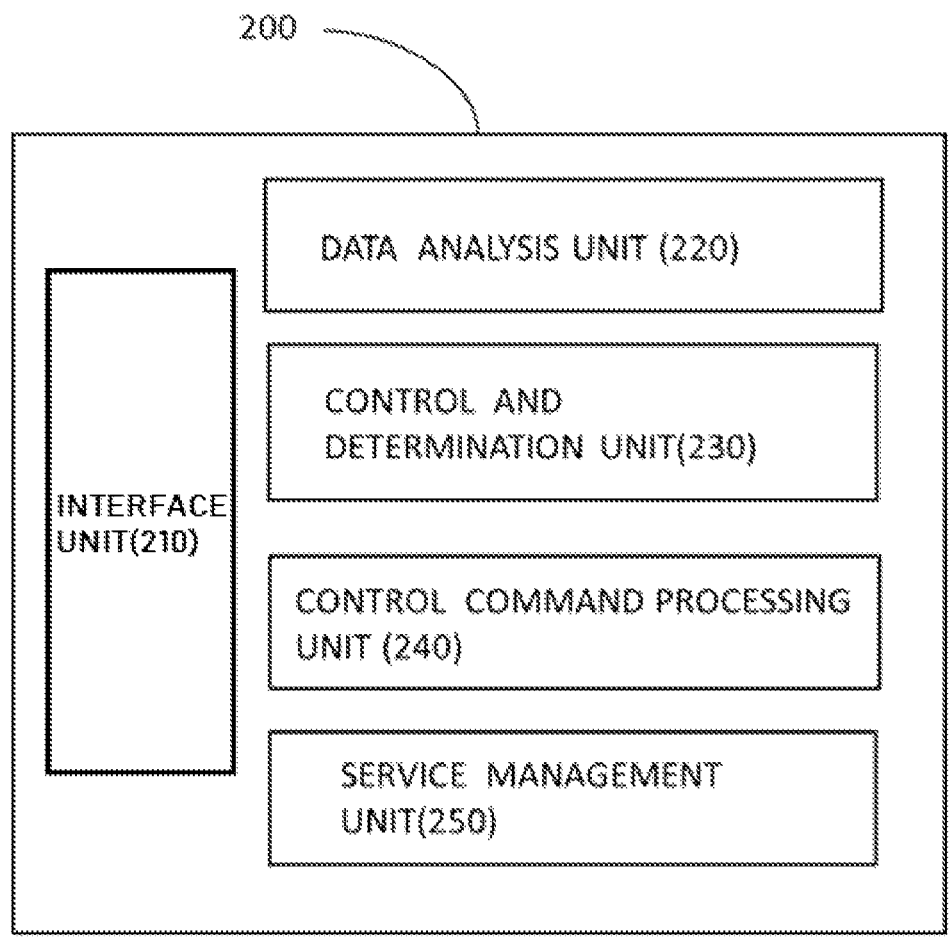
FIG. 5 is a construction block diagram of a real-time control module in the machine-learning-based photovoltaic power generation control system shown in FIG. 2.

FIG. 5 is a construction block diagram of the real-time control module in the machine-learning-based photovoltaic power generation control system shown in FIG. 2.

Referring to FIG. 5, in the machine-learning-based photovoltaic power generation control system according to the present invention, the real-time control module 200 includes an interface unit 210, a data analysis unit 220, a control and determination unit 230, a control command processing unit 240, and a service management unit 250.

The interface unit 210 is configured to perform real-time data transmission and reception between the gateway unit 100 and the real-time control module 200 and between the real-time control module 200 and the machine learning server 300.

Data analyzed, determined, and decided in order to control the node controllers 30 are transmitted as control command data through the interface unit 210, whereby the node controllers 30 perform the function of short circuit or connection together with current, voltage, and electric power production values of the photovoltaic modules.

The data analysis unit 220 receives the current, voltage, and electric power data measured by the photovoltaic modules through the gateway unit 100, and sorts, compares, and analyzes the same.

The data analysis unit 220 receives photovoltaic power generation information, such as current, voltage, and electric power data measured for each photovoltaic module, through the interface unit 210, sorts, compares, and analyzes the data as a pre-processing process, and transmits the same to the control and determination unit 230.

The control and determination unit 230 extracts reference data necessary to control the photovoltaic modules using the result of processing of the data analysis unit 220, and determines a control command.

The control command processing unit 240 defines control data in order to control the photovoltaic modules 10 and transmits the same to the gateway unit 100 in real time.

The service management unit 250 performs a management function of adding or deleting a control function for controlling the photovoltaic modules 10 in the real-time control module 200.

Meanwhile, depending on embodiments, the function of the machine learning server may be performed by the real-time control module 200. In this case, no separate machine learning server is provided, and design change may be performed such that the construction of the machine learning server, a description of which will follow, is included in the real-time control module.

Figure 6:
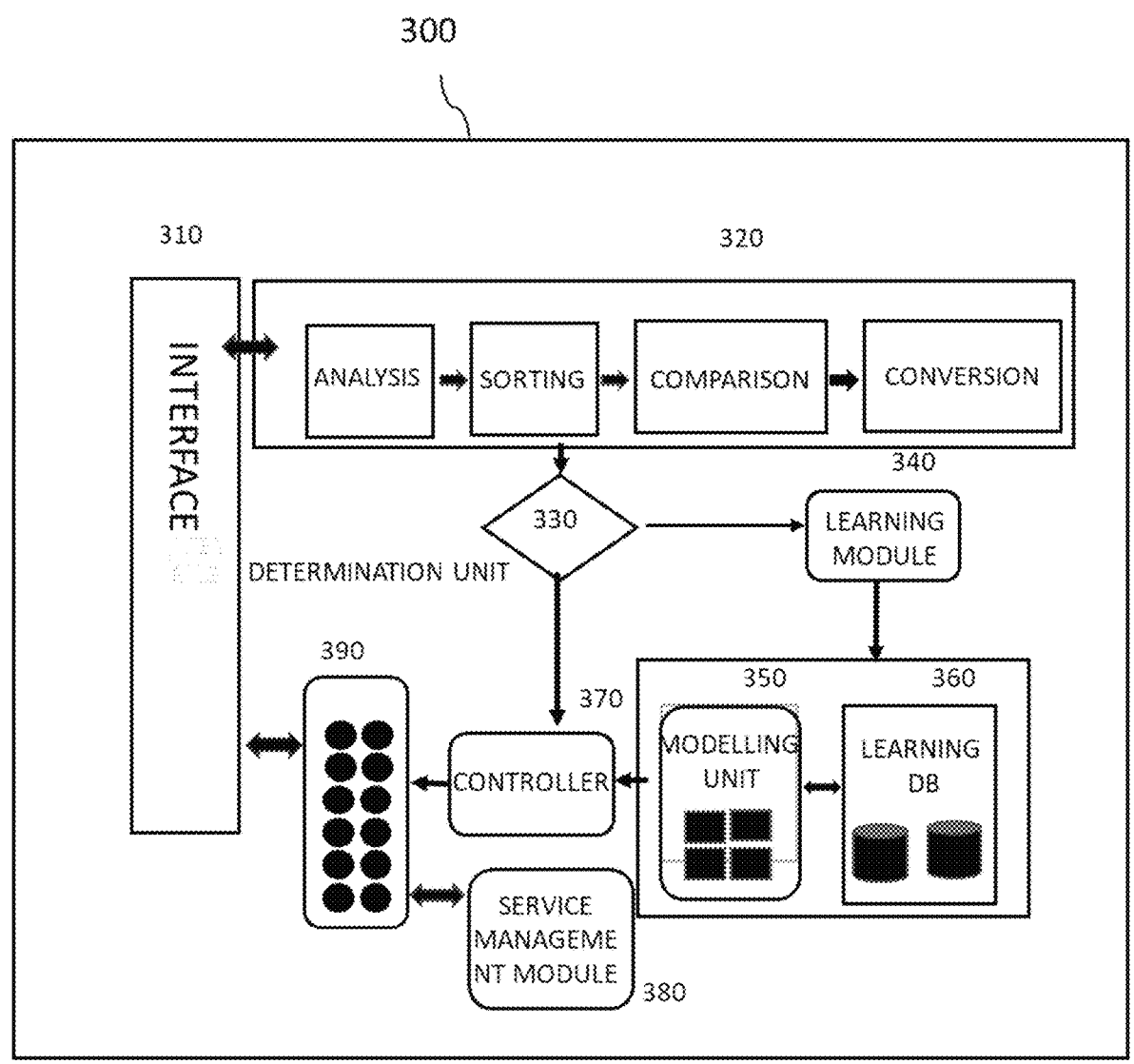
FIG. 6 is a construction block diagram of a machine learning server in the machine-learning-based photovoltaic power generation control system shown in FIG. 2.

FIG. 6 is a construction block diagram of the machine learning server in the machine-learning-based photovoltaic power generation control system shown in FIG. 2.

Referring to FIG. 6, in the machine-learning-based photovoltaic power generation control system according to the present invention, the machine learning server 300 includes an interface unit 310, a monitoring unit 320, a determination unit 330, a learning module 340, a modeling unit 350, a learning database 360, a controller 370, a service management module 380, and a service unit 390.

The interface unit 310 allows the machine learning server to perform real-time data transmission and reception therethrough.

The machine learning server 300 is connected to the real-time control module 200 over the Internet or the communication network, and the interface unit 310 performs real-time data transmission and reception between the real-time control module 200 and the machine learning server 300. In addition, data processed by the machine learning server 300 may be provided through the interface unit 310 as various services or data.

The monitoring unit 320 monitors photovoltaic power generation data transmitted from the photovoltaic power generation construction device including the photovoltaic modules 10, the node controllers 30, the gateway unit 100, and the real-time control module 200 through integrated processing including analysis, sorting, comparison, and conversion based on characteristics thereof.

The monitoring unit 320 receives the photovoltaic power generation construction device and measured data, analyzes and processes profile information of construction devices, such as power generation functions, measured values, changes, and features, and provides the same to the determination unit 330.

The data monitored by the monitoring unit 320 through analysis, sorting, comparison, and conversion are data for machine learning. For example, the data may include connection device protocol information, connection device trouble type information, voltage, current, and electric power data for each module, module trouble type information, weather information, solar altitude information, electric power amount for each module angle, user's electric power information, and information about electric power supplied by KEPCO.

In addition, the determination unit 330 determines whether machine learning is to be performed based on the profile information of the integrated-processed data transmitted from the monitoring unit 320.

As the result of determining whether the data transmitted from the monitoring unit 320 is to be machine-learned, the determination unit 330 transmits data determined to be newly learned to the learning module 340 and transmits data determined not to be newly learned to the controller 370.

The learning module 340 performs new learning for the data necessary to be newly learned according to the determination of the determination unit 330, and the result of learning is stored in the learning database 360.

In addition, the modeling unit 350 extracts data using the result of learning and performs modeling. The result of modeling is stored in the learning database 360.

Examples of modeling according to the data learned by the modeling unit 350 based on machine learning may include connection device recognition modeling (API modeling), protocol modeling for each device, connection device trouble modeling, electric power production forecasting modeling, module trouble (obstacle) modeling, electric power production amount modeling for each weather state/season, electric power production modeling for each module angle, user's electric power use information, and supply electric power modeling.

The controller 370 retrieves modeling data from the learning database 360 in order to control photovoltaic power generation, and transmits the same to the service unit 390 configured to control photovoltaic power generation together with the data determined not to be learned by the determination unit.

The service unit 390 selects one of the reference models transmitted from the controller 370, defines photovoltaic power generation control service data, and transmits the same to the real-time control module 200 through the interface unit 310.

Control services processed by the service unit include photovoltaic power generation balancing control using the node controllers, a multi-model device protocol connection support function, a trouble type diagnosis function for each device, a trouble type function of the module that monitors voltage, current, and electric power amount of each photovoltaic module, electric power production amount and production amount forecasting function of the photovoltaic module based on weather for each device, information service, electric power production amount forecasting and data service based on solar altitude, production amount data service depending on upward, downward, leftward, and rightward angles of the photovoltaic modules, a user's electric power use amount information provision function, and a KEPCO-supplied electric power information provision function.

In FIG. 6, a plurality of modeling lists, obtained as the result of modeling performed by the modeling unit and transmitted to the service unit, is shown in the service unit 390 as a plurality of red circles.

The service management module 380 is configured to delete, add, update, and manage a reference modeling list transmitted to the service unit 390.

Figure 7:
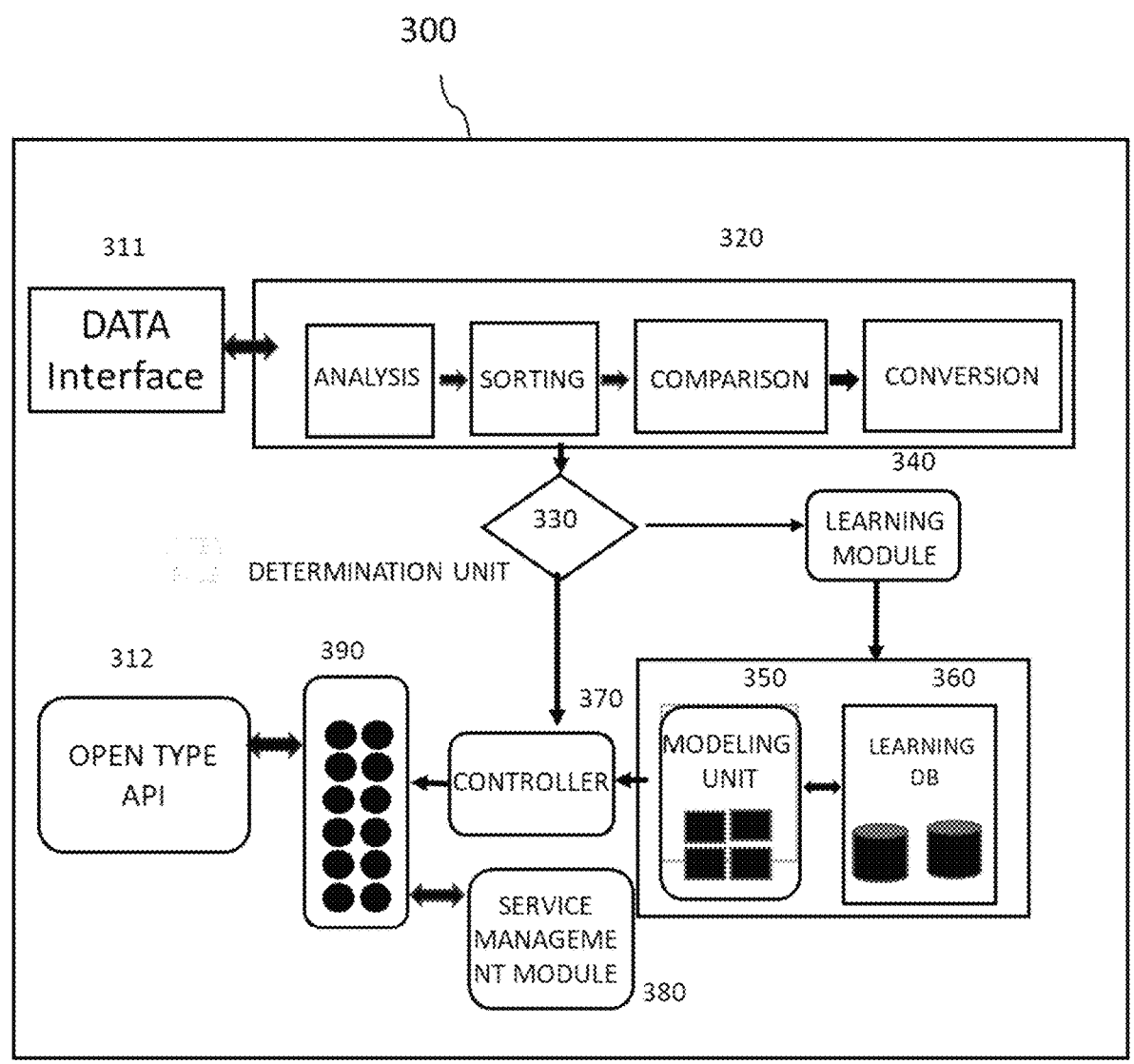
FIG. 7 is another embodiment of the construction block diagram of the machine learning server in the machine-learning-based photovoltaic power generation control system shown in FIG. 2.

FIG. 7 is another embodiment of the construction block diagram of the machine learning server in the machine-learning-based photovoltaic power generation control system shown in FIG. 2.

When comparing FIG. 7 with FIG. 6, the interface unit 310 is divided into a data interface 311 and an open type interface unit (open type API) 312.

The monitoring unit 320 transmits and receives data to and from the real-time control module through the data interface 311.

Meanwhile, the service unit 390 may convert modeling data received from the controller 370 and the data determined not to be learned by the determination unit into an application function so as to correspond to various requirements or may provide information required by various application programs through the open type interface unit 312.

Figure 8:
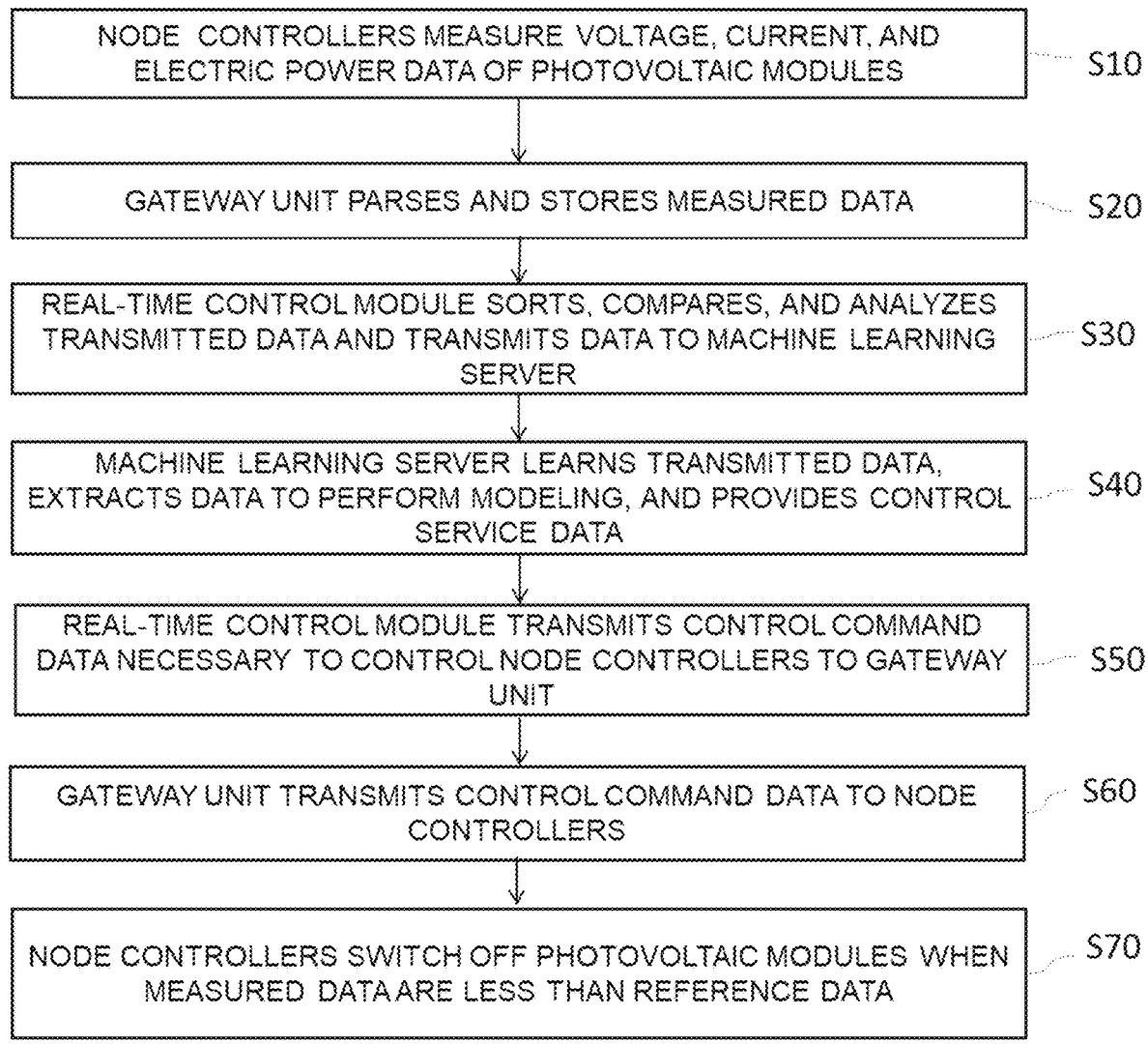
FIG. 8 is a flowchart of a photovoltaic power generation control method according to the present invention.

FIG. 8 is a flowchart of a machine-learning-based photovoltaic power generation control method according to the present invention.

Referring to FIG. 8, the machine-learning-based photovoltaic power generation control method according to the present invention is performed as follows.

First, the node controllers 30 measure voltage, current, and electric power data produced by the photovoltaic modules 10 (S10).

Subsequently, the gateway unit 100 receives the measured data from the node controllers 30, parses the data, and stores the same (S20).

Upon receiving information transmitted from the gateway unit, the real-time control module 200 sorts, compares, and analyzes the parsed data, stores the data in a database, and transmits the same to the machine learning server 300 (S30).

The machine learning server 300 learns the data transmitted from the real-time control module 200 based on machine learning, extracts functional data necessary to control photovoltaic power generation to perform modeling, and provides control service data based on the result of modeling to the real-time control module 200 (S40).

Subsequently, the real-time control module 200 transmits control command data necessary to control the node controllers 30 to the gateway unit (S50).

Subsequently, the gateway unit 100 transmits the control command data received from the real-time control module 200 to the node controllers 30 (S60).

When data measured by the photovoltaic modules 10 are less than current, voltage, and electric power control reference data set according to the control command data, the node controllers 30 switch off the photovoltaic modules connected thereto (S70).

In order to maintain the production amount of electric power uniform, the node controllers 30 switch off the photovoltaic modules connected thereto when the currently measured current, voltage, and electric power data are less than current, voltage, and electric power data set as reference data according to the control command, whereby a greatly reduced amount of electric power produced by each photovoltaic module is controlled to be blocked in order to achieve optimum electric power production. In this way, a balancing function is performed.

Although the present invention has been described in detail with reference to concrete embodiments disclosed herein, it is apparent to those skilled in the art that various modifications and alterations are possible within the scope of the technical idea of the present invention, and it is obvious that such modifications and alterations belong to the appended claims.

INDUSTRIAL APPLICABILITY

According to the present invention, it is possible to collect the power generation amount of photovoltaic modules in real time, to learn the collected information through a machine learning platform, and to uniformly control the amount of electric power produced by the photovoltaic modules based on control information extracted by performing modeling for various service functions according to the result of learning, whereby it is possible to maintain the optimum production amount of electric power. In addition, it is possible to transmit device recognition information and type information to a machine learning server, whereby it is possible to analyze trouble state of a wide-area photovoltaic power generation device and type characteristics thereof in real time and to provide the same to a user.

The invention claimed is:

1. A machine-learning-based photovoltaic power generation control system comprising:
  a plurality of photovoltaic modules configured to convert photovoltaic energy into electrical energy in order to perform photovoltaic power generation, the photovoltaic modules being connected to each other in series so as to be arranged in at least two rows and at least two columns;
  node controllers configured to measure voltage, current, and electric power data produced by the photovoltaic modules and, when the measured data are less than set current, voltage, and electric power control data, to switch off the photovoltaic modules connected thereto;
  a gateway unit configured to receive the voltage, current, and electric power data measured by the photovoltaic modules from the node controllers, to parse the measured data, and to store the measured data;
  a real-time control module configured to receive the parsed data from the gateway unit, to sort, compare, and analyze the received data, to store the data in a database, and to transmit a control command for setting control data necessary to control the node controllers to the gateway unit; and
  a machine learning server connected to the real-time control module over an Internet or a communication network, the machine learning server being configured to monitor a photovoltaic power generation construction device comprising the photovoltaic modules and data, to learn the data transmitted from the real-time control module based on machine learning, to extract functional data necessary to control photovoltaic power generation to perform modeling, and to provide control service data based on a result of modeling to the real-time control module,
  wherein each of the node controllers comprises:
    a measurement unit configured to measure voltage, current, and electric power data produced by a corresponding one of the photovoltaic modules;
    an analysis and control unit configured to compare the measured data with the control data transmitted from the real-time control module, the control data being defined to control current and voltage, and to determine whether the measured data are less than the defined control data to switch an operation of a corresponding one of the photovoltaic modules;
    a data transmission and management unit configured to transmit data stored in the node controller to an outside, to receive the control data from the real-time control module, and to transmit the received control data to the node controller; and
    a switching unit configured to switch off or on the photovoltaic module connected to the node controller based on a result of determination of the analysis and control unit.

2. The machine-learning-based photovoltaic power generation control system according to claim 1, wherein the gateway unit comprises:
  a data collection and management unit configured to transmit the measured data received from the node controllers to the real-time control module, to receive control command data transmitted from the real-time control module, and to transmit the received control command data to the node controllers;
  a data processing unit configured to parse the measured data received from the node controllers; and
  a data storage unit configured to store the data parsed by the data processing unit.

3. The machine-learning-based photovoltaic power generation control system according to claim 1, wherein the real-time control module comprises:
  an interface unit configured to perform real-time data transmission and reception between the gateway unit and the real-time control module and between the real-time control module and the machine learning server;
  a data analysis unit configured to receive the current, voltage, and electric power data measured by the photovoltaic module through the gateway unit and to sort, compare, and analyze the received data;
  a control and determination unit configured to extract reference data necessary to control the photovoltaic modules using a result of processing of the data analysis unit and to determine a control command;
  a control command processing unit configured to define control data in order to control the photovoltaic modules and to transmit the defined control data to the gateway unit in real time; and
  a service management unit configured to perform a management function of adding or deleting a control function for controlling the photovoltaic modules in the real-time control module.

4. The machine-learning-based photovoltaic power generation control system according to claim 1, wherein the machine learning server comprises:
  an interface unit configured to allow the machine learning server to perform real-time data transmission and reception therethrough;

a monitoring unit configured to monitor photovoltaic power generation data transmitted from a photovoltaic power generation construction device comprising the photovoltaic modules, the node controllers, the gateway unit, and the real-time control module through integrated processing comprising analysis, sorting, comparison, and conversion based on characteristics thereof;

a determination unit configured to determine whether machine learning is to be performed based on profile information of the integrated-processed data transmitted from the monitoring unit;

a learning module configured to perform new learning for data necessary to be newly learned according to determination of the determination unit;

a modeling unit configured to extract data using a result of learning and to perform modeling;

a learning database configured to store the result of learning and a result of modeling;

a controller configured to retrieve modeling data from the learning database in order to control photovoltaic power generation and to transmit the modeling data to a service unit configured to control photovoltaic power generation together with data determined not to be learned by the determination unit;

a service unit configured to select one of reference models transmitted from the controller, to define photovoltaic power generation control service data, and to transmit the data to the real-time control module through the interface unit; and a service management module configured to delete, add, update, and manage a modeling data list transmitted to the service unit.

5. The machine-learning-based photovoltaic power generation control system according to claim 4, wherein the monitoring unit is configured to transmit and receive data to and from the real-time control module through a data interface, and the service unit is connected to an open type interface unit, the service unit being configured to convert data received from the controller into an application service so as to be provided or to provide data required by various application programs.

* * * * *